United States Patent
Chen et al.

(10) Patent No.: US 7,335,976 B2
(45) Date of Patent: Feb. 26, 2008

(54) CROSSTALK REDUCTION IN ELECTRICAL INTERCONNECTS USING DIFFERENTIAL SIGNALING

(75) Inventors: Zhaoqing Chen, Poughkeepsie, NY (US); Christian Schuster, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 11/137,245

(22) Filed: May 25, 2005

(65) Prior Publication Data

US 2006/0267048 A1 Nov. 30, 2006

(51) Int. Cl.
*H01L 23/48* (2006.01)
*H01L 23/04* (2006.01)

(52) U.S. Cl. .................... 257/690; 257/698
(58) Field of Classification Search ........ 257/690–700
See application file for complete search history.

(56) References Cited

U.S. PATENT DOCUMENTS

| 4,736,385 A | 4/1988 | Pratt et al. |
| 5,357,050 A | 10/1994 | Baran et al. |
| 5,430,247 A | 7/1995 | Bockelman |
| 5,539,321 A | 7/1996 | Sciacero et al. |
| 5,887,032 A | 3/1999 | Cioffi |
| 5,966,407 A | 10/1999 | Hiraki et al. |
| 6,008,705 A | 12/1999 | Ghoshal |
| 6,340,795 B1 | 1/2002 | Caldwell |
| 6,385,252 B1 | 5/2002 | Gradl et al. |
| 6,423,909 B1 | 7/2002 | Haynie et al. |
| 6,479,758 B1 * | 11/2002 | Arima et al. ............... 257/691 |
| 6,606,732 B2 | 8/2003 | Buffet et al. |
| 2002/0018528 A1 | 2/2002 | Harada et al. |
| 2004/0097112 A1 | 5/2004 | Minich et al. |
| 2004/0103218 A1 | 5/2004 | Blumrich et al. |
| 2005/0202722 A1 * | 9/2005 | Regnier et al. ............. 439/608 |

FOREIGN PATENT DOCUMENTS

JP  2001 217348  8/2001

* cited by examiner

*Primary Examiner*—Cuong Nguyen
(74) *Attorney, Agent, or Firm*—Keusey, Tutunjian & Bitetto, P.C.; Anne V. Dougherty, Esq.

(57) ABSTRACT

An electrical device includes a plurality of interconnects passing through a plane. The interconnects have a longitudinal axis substantially perpendicular to the plane and including an arrangement pattern which reduces or eliminates cross-talk between nearest neighboring interconnects, wherein the interconnects include a first differentially driven signal conductor pair and at least one other signal conductor, and the arrangement includes the at least one other signal conductor disposed at a substantially same distance from each conductor of the first differentially driven signal conductor pair.

12 Claims, 5 Drawing Sheets

CROSSTALK REDUCTION IN ELECTRICAL INTERCONNECTS USING DIFFERENTIAL SIGNALING

BACKGROUND

1. Technical Field

The present invention relates to electrical interconnects in integrated circuits or the like, and more particularly to a system and method for reducing crosstalk between conductors.

2. Description of the Related Art

Signal leads or electrical conductors may suffer from cross-talk. Cross-talk is an unintentional coupling of signal energy between interconnects or conductors that may adversely impact transmission performance. Electrical interconnects that carry a signal between a transmitting and a receiving device may include, among other structures, lines and vias in printed circuit boards, packages, integrated circuits, cables, and connectors.

In the case where at least one interconnect includes differential signaling (as opposed to single-ended signaling), one signal is carried by two conductors with the two conductors having different signal polarities (as opposed to single-ended signaling where only one conductor is present). When another differential pair of conductors or a single-ended conductor is nearby, crosstalk will occur.

SUMMARY

An electrical device includes a plurality of interconnects passing through a plane. The interconnects have a longitudinal axis substantially perpendicular to the plane and include an arrangement pattern which reduces or eliminates cross-talk between nearest neighboring interconnects. The interconnects include a first differentially driven signal conductor pair and one or more other signal conductors, and the arrangement includes the other signal conductor disposed at a substantially same distance from each conductor of the first differentially driven signal conductor pair.

An integrated circuit includes at least one layer forming a plane and having a plurality of interconnects passing through at least a portion of the layer. The interconnects have a longitudinal axis substantially perpendicular to the plane and including an arrangement pattern which reduces or eliminates cross-talk between nearest neighboring interconnects, wherein the interconnects include a first differentially driven signal conductor pair with conductors arranged next to each other in a first direction and a single conductor disposed substantially equidistant from each of the first differentially driven signal conductor pair such that the arrangement includes an alternating repeating pattern of first differentially driven signal conductor pairs and single conductors along a second direction which is perpendicular to the first direction.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFFERED EMBODIMENTS

Figure 1:
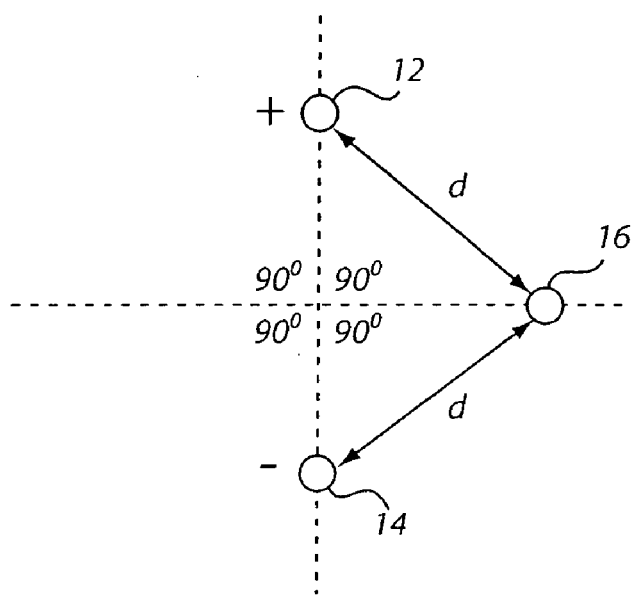
FIG. 1 is a diagram showing a cross-sectional view of conductors arranged to reduce or eliminate cross-talk therebetween in accordance with one embodiment of the present invention.

The present invention provides structures that reduce the crosstalk by arrangements of conductors. In particularly useful embodiments, three illustrative structures are provided to reduce nearest neighbor crosstalk.

In one illustrative embodiment, cross-talk is addressed between one differentially driven signal pair and one single-ended signal by positioning differential conductors equidistant or substantially equidistant to the single-ended conductor over the cross section of an interconnect. This will be referred to as structure A, for ease of reference. Substantially equidistant includes a set tolerance within which the conductors may be located. For example, the tolerances associated with printed wiring boards for straightness, flatness and the like or the minimum features sizes etc, for chips. It is to be noted that the cross-talk will be reduced the most when the conductors are equidistant.

In another illustrative embodiment, cross-talk between two different differentially driven signal pairs is addressed by positioning the differential conductors of one pair equidistant to the differential conductors of the other pair over the cross section of the interconnect. This will be referred to as structure B, for ease of reference.

In yet another embodiment, cross-talk is addressed between two different differentially driven signal pairs and an arbitrary conductor environment by positioning the differential conductors of one pair equidistant to the differential conductors of the other pair and vice versa. This will be referred to as structure C, for ease of reference.

Structures A and B work on the principle of exact cancellation of crosstalk induced by a positive and a negative signal of a differential pair and the insensitivity of differential signaling to common mode crosstalk, i.e., crosstalk of the same polarity on both conductors. Structure C works on the principle of vectorial addition of crosstalk sources. All structures may include more than one aggressor and one victim interconnect and permit the presence of ground conductors as long as symmetry is preserved.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc. Such a software embodiment may take the form of a circuit design modeling program or diagnostic program.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The present invention may be employed in or applied to a circuit as described herein as part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The circuit or circuits may include, among other structures, lines and vias in printed circuit boards, packages, integrated circuits, cables, connectors or other devices.

Referring now to the drawings in which like numerals represent the same or similar elements and initially to FIG. 1, a diagram shows a cross section of conductors 12, 14 and 16, e.g., in a printed circuit board or integrated circuit (IC) package. FIG. 1 corresponds to structure A as described above. A pair of conductors 12 and 14 are also indicated by "+" and "−". The arrangement in FIG. 1 represents a differential interconnect. A single-ended interconnect 16 is at a distance d between from conductor 12 which is the same or substantially the same as the distance d from conductor 14. Benefits of the present invention may still be provided if the distances d are substantially the same. This means that while it is preferred to have the distances equal that the arrangement can still be beneficial if the distances, d, are within about, e.g., 20% of each other. Other percentages are also contemplated.

This may be restated saying that the perpendicular bisector of the connection between 12 and 14 goes through 16. This structure will show no relevant crosstalk since:

Any signal coupled into 16 from 12 will be cancelled out by the signal coupled into 16 from 14. Any signal coupled from 16 into 12 and 14 will have the same polarity and thus not be apparent to a differential termination (common mode noise rejection).

Figure 2:
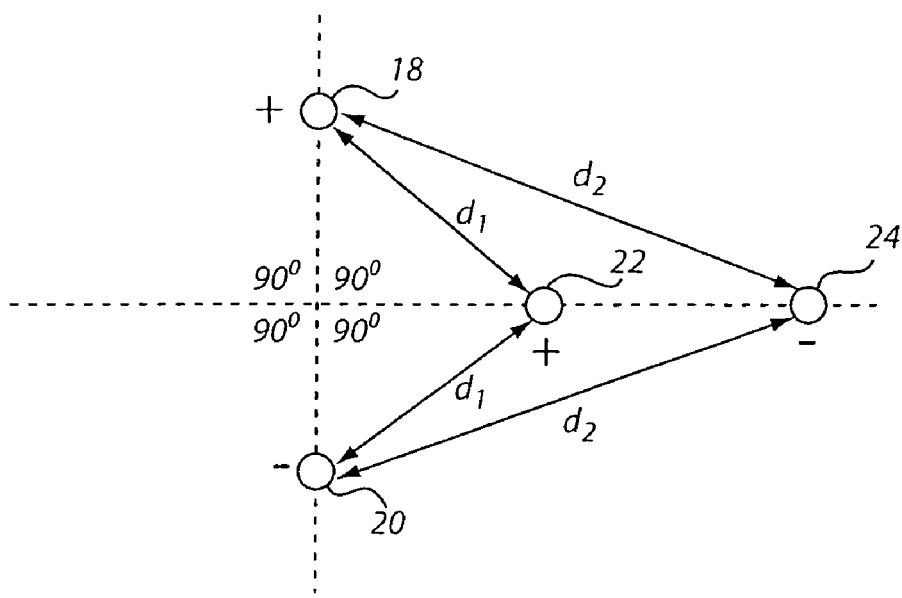
FIG. 2 is a diagram showing a cross-sectional view of two differential pair conductors arranged to reduce or eliminate cross-talk therebetween in accordance with another embodiment of the present invention.

Referring to FIG. 2, the definition of structure B is illustratively shown, which includes the cross section of, e.g., conductors in a printed circuit board or IC package. The pair 18 and 20 represents a differential interconnect while 22 and 24 represent another differential interconnect. The distance d1 between conductor 18 and 22 is the same as between 20 and 22. The distance d2 between conductor 18 and 24 is the same as between 20 and 24. This is equivalent to saying that the perpendicular bisector of the connection between 18 and 20 is equal to the symmetry axis of 22 and 24. This structure will show no relevant crosstalk since:

Any signal coupled into 24 from 18 will be cancelled out by the signal coupled into 24 from 20. Any signal coupled into 22 from 18 will be cancelled out by the signal coupled into 22 from 20. Any signal coupled from 22 into 18 and 20 will have the same polarity and thus not be apparent to a differential termination (common mode noise rejection).

Any signal coupled from 24 into 18 and 20 will have the same polarity and thus be not apparent to a differential termination (common mode noise rejection).

Figure 3:
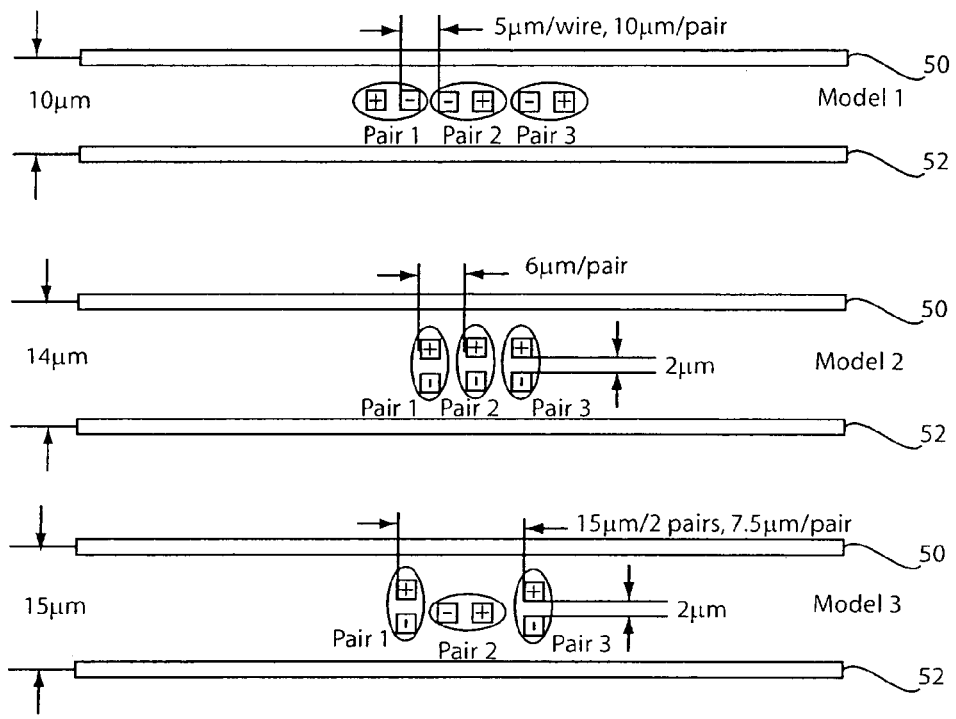
FIG. 3 is a diagram showing three models used in a simulation, model 3 includes an inventive arrangement, while models 1 and 2 include conventional arrangements.

Referring to FIG. 3, a simulation of different configurations was performed. To verify that predicted crosstalk reduction, numerical simulations were performed for the three different interconnect models depicted in FIG. 3. Models 1 and 2 show common layout choices typically employed in the art. Grounded conductors 50 and 52 were added to each model. Model 3 shows structure B, as described above in accordance with the present invention. All models shown have three differential pairs of interconnects indicated as pair 1, pair 2 and pair 3. Illustrative dimensions are shown. Note "+" and "−" signs indicate the differential polarities of each conductor in the pair.

For each model, copper conductors having a resistivity of $2.0 \times 10^{-6}$ Ω-cm and a thickness and width of 2 microns were employed. The dielectric material between the ground conductors 50 and 52 includes a dielectric loss tangent, $\tan(\delta) = 0.001$ and the dielectric constant, $\epsilon_r = 4.2$ for the present simulation.

Figure 4:
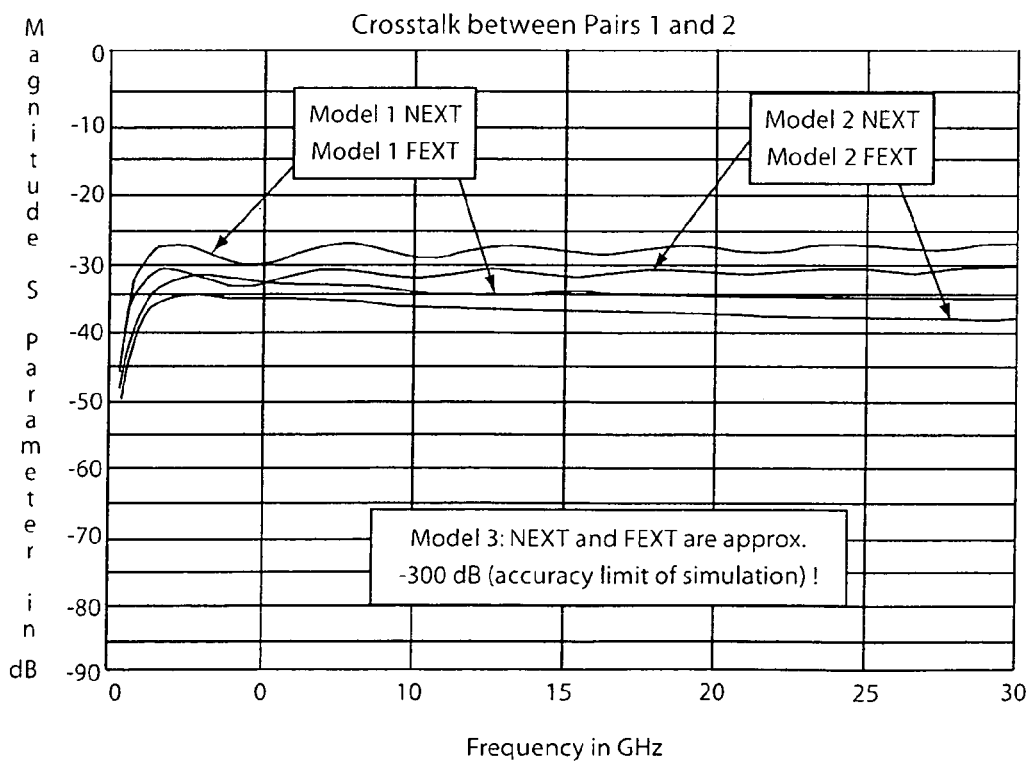
FIG. 4 is a plot of cross-talk scattering parameters (a measure of power) versus frequency for the three models of FIG. 3.

Referring to FIG. 4, the simulation results in the frequency domain for near end crosstalk (NEXT) and far end crosstalk (FEXT) are illustratively shown. Models 1 and 2 show crosstalk in the range of −40 dB to −30 dB while model 3 shows crosstalk in the range of −300 dB! This is negligible and corresponds with zero crosstalk within the accuracy of the simulation.

Figure 5:
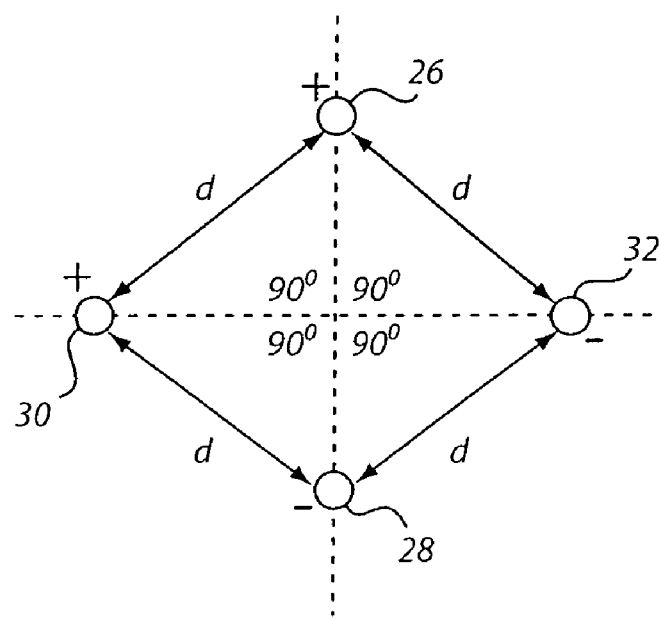
FIG. 5 is a diagram showing a cross-sectional view of conductors arranged to reduce or eliminate cross-talk therebetween and an arbitrary conductor environment in accordance with yet another embodiment of the present invention.

Referring to FIG. 5, structure C is illustratively shown depicting a cross section of conductors, e.g., in a printed circuit board or IC package. It is a special case of structure B where d=d1=d2. The perpendicular bisector of the connection between conductor of differential pair 26 and 28 is equal to the symmetry axis of differential pair 30 and 32 and vice versa. This structure shows no relevant crosstalk for the same reasons as stated above.

The arrangement of two differential pairs according to structure C has the additional benefit of reduced crosstalk generation in the space surrounding the conductors. An explanation may be made by the analogy to electric dipoles.

Figure 6:
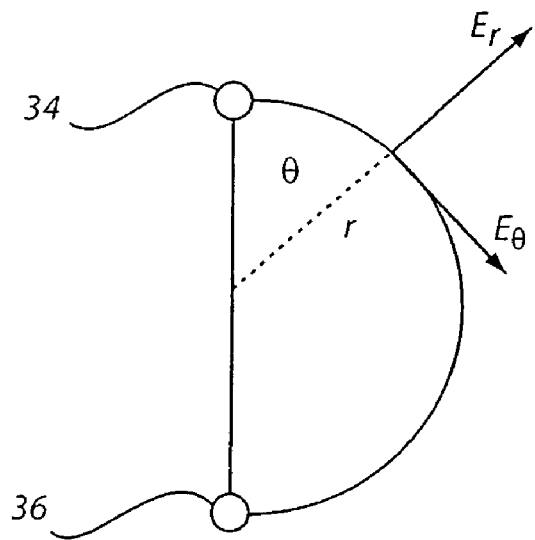
FIG. 6 is a diagram showing a dipole analogy for analyzing structures in accordance with one embodiment of the present invention.

Referring to FIG. 6, an electric far field of a dipole E is shown in spherical coordinates in dependence of the angle θ. The dipole field components include $E_r$ and $E_\theta$ where:

$$E_r(\theta) = 2*K*\cos(\theta) \quad (1)$$

$$E_\theta(\theta) = K*\sin(\theta) \text{ where } K \text{ is a constant.} \quad (2)$$

There is no field component in the φ direction. The proportionality constant, K, includes a dependency on radius, r. Equations 1 and 2 assume that the distance between positive and negatively charged dipoles 34 and 36 is small compared to r.

Figure 7:
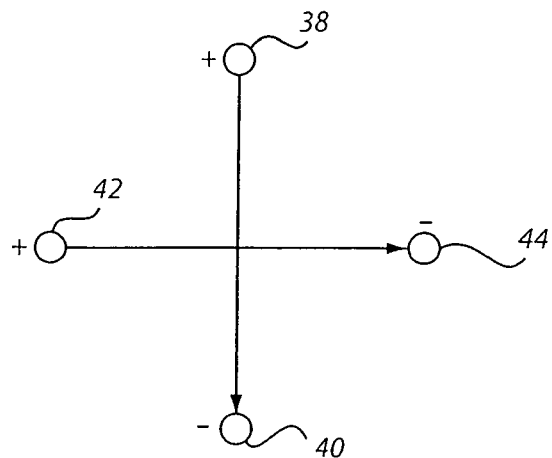
FIG. 7 a diagram showing a dipole analogy using two dipoles for analyzing structures in accordance with one embodiment of the present invention.

Referring to FIG. 7, the orientation of two dipole pairs is illustratively shown as described for structure C. The far field varies for dipole 38 and 40 as indicated by $E^1$ and for dipole 42 and 44 as indicated by $E^2$ (not E squared)

$$E^1_r(\theta) = 2*K*\cos(\theta) \quad (3)$$

$$E^1_\theta(\theta) = K*\sin(\theta) \quad (4)$$

$$E^2_r(\theta) = 2*K*\cos(\theta+90°) \quad (5)$$

$$E^2_\theta(\theta) = K*\sin(\theta+90°) \quad (6)$$

where K is a constant.

The two electric far fields, $E^1$ and $E^2$, can be superposed and the resulting total field, $E^T$, is:

$$E_r^T(\theta) = E_r^1(\theta) + E_r^2(\theta) = \sqrt{2} \cdot 2 \cdot K \cdot \cos(\theta+45°)$$

$$E_\theta^T(\theta) = E_\theta^1(\theta) + E_\theta^2(\theta) = \sqrt{2} \cdot 2 \cdot K \cdot \sin(+45°) \quad (7)$$

The maximum of the total far field is never greater than a factor of the square root of 2(approx. 1.41421 . . . ) times the maximum of one far field instead of being two times the maximum in a worst case arrangement. This correlates to a reduction of approximately 30% in field strength. A similar statement can be made for magnetic dipoles. By equating electric dipole far fields with capacitative coupling and magnet dipole far fields with inductive coupling it becomes clear the structure C presents a reduced crosstalk source to the environment.

It should be noted that the dipole strengths do not have to be exactly the same to achieve at least some crosstalk reduction. This is equivalent to saying that the signals transmitted by the two differential interconnects are different from each other.

Figure 8:
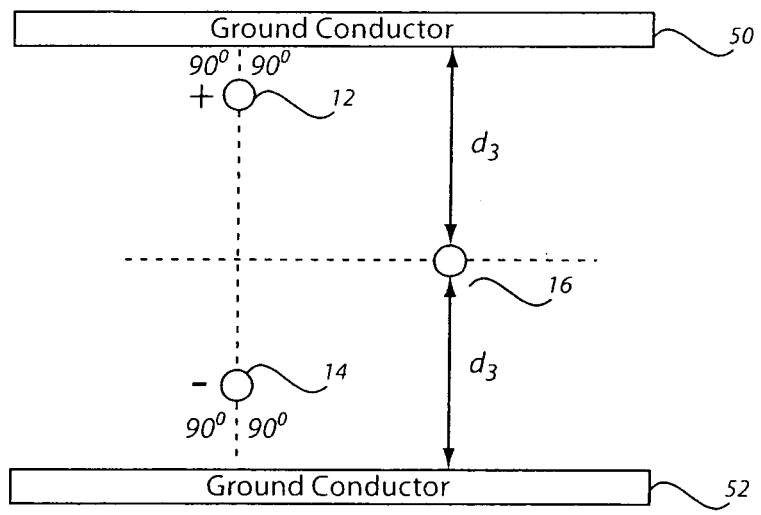
FIGS. 8 and 9 are diagrams showing a symmetrical disposition of ground conductors in accordance with embodiments of the present invention.
Figure 9:
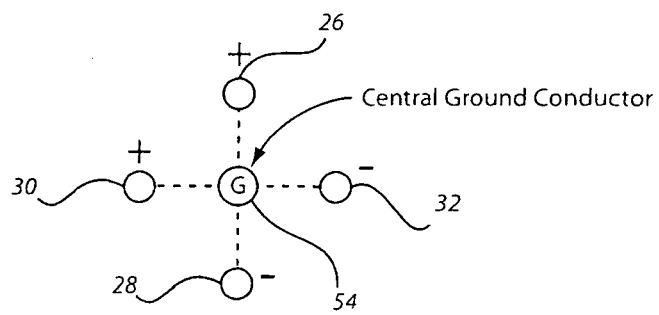

It should be noted that structures A, B and C can be used in configurations where additional ground conductors are present. The ground conductors are preferably introduced in such a way that they do not break the symmetry. FIG. 8 shows an example for structure A that could be applied to structure B as well. FIG. 9 shows an example for structure C. Other arrangements are also contemplated.

Referring to FIG. 8, two ground conductors or ground planes 50 and 52 are symmetrically disposed relative to differential conductors 12 and 14. If an additional conductor 16 (or conductors) is/are placed in this configuration, they are preferably placed symmetrically with respect to grounds 50 and 52. For example, conductor 16 is placed substantially equidistant or equidistant for both ground conductor 50 and ground conductor 52 as indicated by $d_3$.

Referring to FIG. 9, a central ground conductor 54 is centrally placed equidistant or substantially equidistant from opposing conductors (e.g., 26 and 28, and/or 30 and 32).

Figure 10:
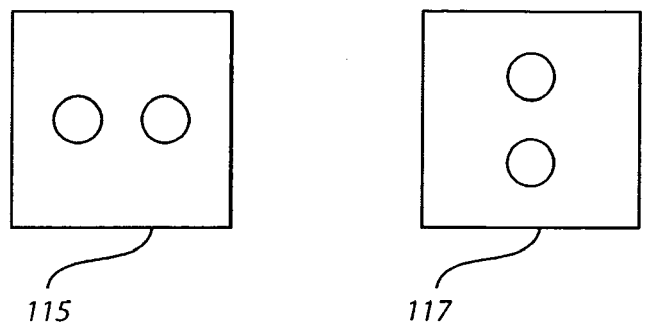
FIG. 10 is a cross-sectional view of a layer of an integrated circuit showing two interconnect differential pairs arranged in accordance with one embodiment of the present invention.

Referring to FIG. 10, structures A, B and C can be used in scenarios with more than one aggressor and more than one victim interconnect. Two neighboring differentially driven thru vias 115 and 117 in an IC package are shown.

This is an example of structure B. Each interconnect is centered in a virtual box, say, e.g., 250 microns×250 microns. There is no differential crosstalk between interconnect 115 and interconnect 117.

Figure 11:
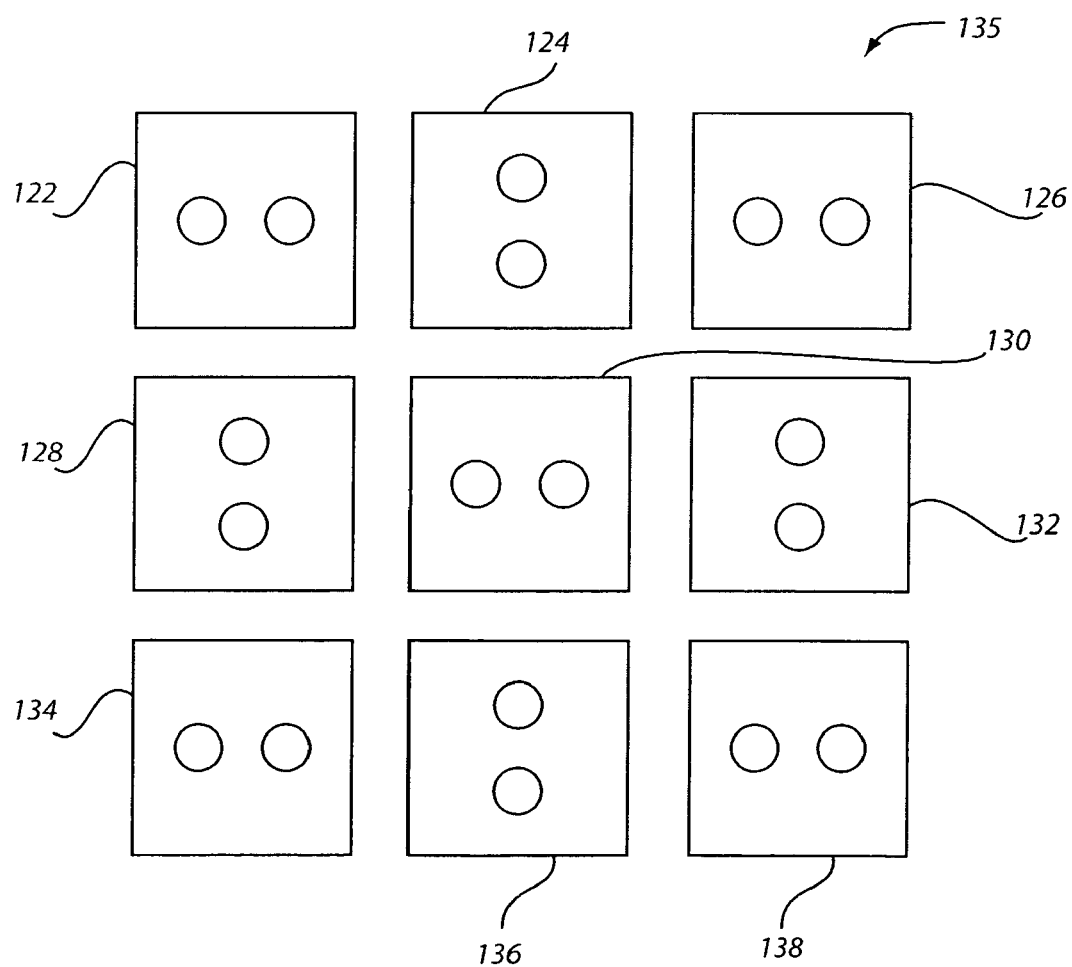
FIG. 11 is a cross-sectional view of a layer of an integrated circuit showing differential pairs for a plurality of interconnects extending along two directions and arranged in accordance with one embodiment of the present invention.

Referring to FIG. 11, an arrangement of nine interconnect-pairs 122-136 are configured in accordance with structure B. The center interconnect 130 is supposed to be the aggressor while all surrounding interconnects 122, 124, 126, 128, 132, 134, 136 and 138 are possible crosstalk victims. There is no differential crosstalk to all the nearest neighbors (124, 128, 132 and 136) for the reasons stated above. Differential crosstalk may exist for the next nearest neighbors in the four corners (e.g., 122, 126, 134, and 138). However, crosstalk at the next nearest neighbors is at a much smaller level due to increased distance.

The interconnects are preferably disposed in a layer of dielectric 135 material. Interconnects 122-138 are provided to make electrical connections between metal lines or other structures above and below the plane of the depicted by the page.

The interconnect pairs in FIGS. 10 and 11 may be part of a semiconductor circuit, printed wiring board, or any other electronic or electrical device. Although described in terms of vias or interconnects, the advantages of the present invention can be realized in metal lines of an IC, as well. For example, transmission or other electrical lines in printed wiring boards, which may run along the board, may be arranged in accordance with the structures of the present invention. In addition, interconnects connecting these lines (e.g., perpendicular to the board) may be arranged in accordance with the structures of the present invention.

In integrated circuits, metal lines or other electrical conductors may run along (parallel) to the surface of the chip or device and may be arranged in accordance with the structures of the present invention. In addition, interconnects connecting these lines (e.g., perpendicular to a major surface of the chip) may be arranged in accordance with the structures of the present invention.

The present invention may also be applicable to cables (e.g., the structure shown by cross-sections in FIGS. 5 and 9) having multiple conductors therein or for arranging cables or wires using mechanical devices, such as cable harnesses or the like. These structures may be arranged in accordance with the structures of the present invention.

Having described preferred embodiments for crosstalk reduction in electrical interconnects using differential signaling (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. An electrical device, comprising:
   a plurality of interconnects passing through a plane;
   the interconnects having a longitudinal axis substantially perpendicular to the plane and including an arrangement pattern which reduces or eliminates cross-talk between nearest neighboring interconnects, wherein the interconnects include a first differentially driven signal conductor pair and at least one other signal conductor, and the arrangement includes the at least one other signal conductor disposed substantially equidistant from each conductor of the first differentially driven signal conductor pair, wherein the at least one other signal conductor includes a single-ended signal conductor.

2. The electrical device as recited in claim 1, wherein the at least one other signal conductor includes a second differentially driven signal pair.

3. The electrical device as recited in claim 2, wherein each conductor of the second differentially driven signal pair is substantially equidistant from each of the first differentially driven signal pair.

4. The electrical device as recited in claim 2, wherein each conductor of the first and the second differentially driven signal pairs are substantially equidistant from each other.

5. The electrical device as recited in claim 1, wherein the electrical device includes an integrated circuit chip.

6. The electrical device as recited in claim 1, wherein the electrical device includes a printed wiring board.

7. The electrical device as recited in claim 1, further comprising a ground structure symmetrically disposed relative to the interconnects in the arrangement.

8. The electrical device as recited in claim 7, wherein the ground structure includes at least two lines running parallel to the plane and being substantially equidistant from a line of symmetry defined by the interconnects in the arrangement.

9. The electrical device as recited in claim 7, wherein the ground structure includes a line running perpendicular to the plane and being substantially equidistant from the interconnects in the arrangement.

10. An integrated circuit, comprising:
    at least one layer forming a plane and having a plurality of interconnects passing through at least a portion of the layer;
    the interconnects having a longitudinal axis substantially perpendicular to the plane and including an arrangement pattern which reduces or eliminates cross-talk between nearest neighboring interconnects, wherein the interconnects include a first differentially driven signal conductor pair having conductors of the pair arranged next to each other in a first direction and a single-ended signal conductor disposed substantially equidistant from each of the first differentially driven signal conductor pair such that the arrangement includes an alternating repeating pattern of first differentially driven signal conductor pairs and single-ended signal conductors along a second direction which is perpendicular to the first direction.

11. The integrated circuit device as recited in claim 10, wherein the alternating repeating pattern continues along the first direction.

12. The integrated circuit device as recited in claim 10, further comprising a ground structure symmetrically disposed relative to the interconnects in the arrangement.

* * * * *